(12) United States Patent
Hyland et al.

(10) Patent No.: US 7,883,835 B2
(45) Date of Patent: Feb. 8, 2011

(54) METHOD FOR DOUBLE PATTERNING A THIN FILM

(75) Inventors: Sandra L. Hyland, Guilderland, NY (US); Shannon W. Dunn, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 788 days.

(21) Appl. No.: 11/534,538

(22) Filed: Sep. 22, 2006

(65) Prior Publication Data

US 2008/0076075 A1 Mar. 27, 2008

(51) Int. Cl.
*H01L 21/312* (2006.01)
(52) U.S. Cl. .................. 430/313; 430/312; 430/394; 430/396
(58) Field of Classification Search .................. None
See application file for complete search history.

(56) References Cited

U.S. PATENT DOCUMENTS

| 5,753,417 | A | 5/1998 | Ulrich |
|---|---|---|---|
| 7,432,191 | B1 | 10/2008 | Stamper et al. |
| 2002/0081531 | A1 | 6/2002 | Jain |
| 2003/0129531 | A1 | 7/2003 | Oberlander et al. |
| 2003/0205658 | A1 | 11/2003 | Voisin |
| 2005/0074699 | A1 | 4/2005 | Sun et al. |
| 2005/0116231 | A1 | 6/2005 | Kang et al. |
| 2005/0153538 | A1 | 7/2005 | Tsai et al. |
| 2005/0167394 | A1 | 8/2005 | Iiu et al. |
| 2006/0003268 | A1 | 1/2006 | Hong et al. |
| 2006/0177772 | A1 | 8/2006 | Abdallah et al. |
| 2006/0222968 | A1 | 10/2006 | Talin et al. |
| 2006/0223245 | A9 | 10/2006 | Pellens et al. |
| 2006/0290012 | A1 | 12/2006 | Sadjadi |
| 2007/0077523 | A1 | 4/2007 | Finders |
| 2007/0148598 | A1 | 6/2007 | Colburn et al. |
| 2007/0166648 | A1 | 7/2007 | Ponoth et al. |
| 2008/0020327 | A1 | 1/2008 | Yang et al. |

OTHER PUBLICATIONS

U.S. Patent and Trademark Office, Non-final Office Action received in related U.S. Appl. No. 11/534,420 dated Dec. 23, 2008, 23 pp.
U.S. Patent and Trademark Office, Final Office Action received in U.S. Appl. No. 11/534,365 dated Mar. 19, 2009, 16 pp.
State Intellectual Property Office of the People's Republic of China, First Office Action received in related Chinese Patent Application No. 200710151302.9 dated Jan. 16, 2009, 7 pp.
U.S. Patent and Trademark Office, Non-final Office Action received in related U.S. Appl. No. 11/534,261 dated Jan. 15, 2009, 12 pp.
U.S. Patent and Trademark Office, Non-final Office Action received in related U.S. Appl. No. 11/534,477 dated Jan. 12, 2009, 14 pp.
U.S. Patent and Trademark Office, Non-final Office Action received in related U.S. Appl. No. 11/534,365 dated Jun. 24, 2008, 14 pp.
U.S. Patent and Trademark Office, Non-final Office Action received in related U.S. Appl. No. 11/534,477 dated Jun. 23, 2008, 22 pp.
U.S. Patent and Trademark Office, Non-final Office Action received in related U.S. Appl. No. 11/534,261 dated Jun. 23, 2008, 14 pp.
European Patent Office, International Search Report and Written Opinion received in related PCT Application No. PCT/US2007/077166 dated Dec. 20, 2007, 13 pp.
U.S. Patent and Trademark Office, Non-final Office Action received in related U.S. Appl. No. 11/623,247 dated Oct. 9, 2003, 14 pp.
U.S. Patent and Trademark Office, Non-final Office Action received in related U.S. Appl. No. 11/623,237 dated Sep. 15, 2009, 16 pp.
U.S. Patent and Trademark Office, Non-final Office Action received in related U.S. Appl. No. 11/534,365 dated Sep. 4, 2009, 15 pp.
U.S. Patent and Trademark Office, Final Office Action received in related U.S. Appl. No. 11/534,261 dated Aug. 28, 2009, 12 pp.
U.S. Patent and Trademark Office, Final Office Action received in related U.S. Appl. No. 11/534,477 dated Aug. 7, 2009, 17 pp.
U.S. Patent and Trademark Office, Non-final Office Action received in related U.S. Appl. No. 11/623,247 dated Jun. 2, 2009, 17 pp.

(Continued)

*Primary Examiner*—Daborah Chacko Davis
(74) *Attorney, Agent, or Firm*—Wood, Herron & Evans, LLP

(57) ABSTRACT

A method of double patterning a thin film is described. The method comprises forming a thin film to be patterned on a substrate, forming an anti-reflective coating (ARC) layer on the thin film, and forming a mask layer on the ARC layer. Thereafter, the mask layer is patterned to form a first pattern and a second pattern therein, and the first and second patterns are partially transferred to the ARC layer using a transfer process, such as an etching process or a developing process. Once the mask layer is removed, the first pattern and second patterns are completely transferred to the ARC layer using an etching process, and the first and second patterns in the ARC layer are transferred to the underlying thin film using another etching process.

29 Claims, 18 Drawing Sheets

OTHER PUBLICATIONS

U.S. Patent and Trademark Office, Final Office Action received in related U.S. Appl. No. 11/623,247 dated Dec. 18, 2009, 18 pp.
U.S. Patent and Trademark Office, Non-final Office Action received in related U.S. Appl. No. 11/534,365 dated Feb. 22, 2010, 18 pp.
U.S. Patent and Trademark Office, Non-final Office Action received in related U.S. Appl. No. 11/623,237 dated Mar. 9, 2010, 18 pp.
U.S. Patent and Trademark Office, Advisory Action received in related U.S. Appl. No. 11/623,247 dated Mar. 10, 2010, 7 pp.
U.S. Patent and Trademark Office, Non-final Office Action received in related U.S. Appl. No. 11/534,477 dated Oct. 23, 2009, 16 pp.
U.S. Patent and Trademark Office, Non-final Office Action received in related U.S. Appl. No. 11/534,477 dated Jul. 22, 2010, 14 pp.
U.S. Patent and Trademark Office, Non-final Office Action received in related U.S. Appl. No. 11/534,261 dated Apr. 5, 2010, 13 pp.
U.S. Patent and Trademark Office, Final Office Action received in related U.S. Appl. No. 11/537,477 dated Apr. 30, 2010, 10 pp.
U.S. Patent and Trademark Office, Notice of Allowance received in related U.S. Appl. No. 11/623,247 dated Jun. 22, 2010, 11 pp.
U.S. Patent and Trademark Office, Final Office Action received in related U.S. Appl. No. 11/534,365 dated Aug. 20, 2010, 13 pp.
U.S. Patent and Trademark Office, Final Office Action received in related U.S. Appl. No. 11/623,237 dated Aug. 20, 2010, 17 pp.

METHOD FOR DOUBLE PATTERNING A THIN FILM

CROSS-REFERENCE TO RELATED APPLICATIONS

This application is related to co-pending U.S. patent application Ser. No. 11/534,261, entitled "METHOD FOR DOUBLE IMAGING A DEVELOPABLE ANTI-REFLECTIVE COATING" (TTCA-157), filed on even date herewith; co-pending U.S. patent application Ser. No. 11/534,365, entitled "METHOD FOR DOUBLE PATTERNING A DEVELOPABLE ANTI-REFLECTIVE COATING" (TTCA-158), filed on even date herewith; co-pending U.S. patent application Ser. No. 11/534,477, entitled "METHOD OF PATTERNING A DEVELOPABLE ANTI-REFLECTIVE COATING BY PARTIAL DEVELOPING" (TTCA-160), filed on even date herewith; and co-pending U.S. patent application Ser. No. 11/534,420, entitled "METHOD OF PATTERNING AN ANTI-REFLECTIVE COATING BY PARTIAL ETCHING" (TTCA-159), filed on even date herewith. The entire contents of these applications are herein incorporated by reference in their entirety.

BACKGROUND OF THE INVENTION

1. Field of the Invention

The present invention relates to a method for double patterning a thin film on a substrate, and more particularly to a method for double patterning a thin film on a substrate by partially transferring a double pattern to an anti-reflective coating (ARC) layer overlying the thin film.

2. Description of Related Art

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, the substrate is exposed to a first pattern, the first pattern is developed in the light-sensitive material, the first pattern formed in the light-sensitive material is transferred to an underlying layer using an etching process, and then this series of steps is repeated for a second pattern.

Additionally, once the pattern is transferred to the underlying thin film, it is essential to remove the mask layer while not damaging the material properties of the underlying thin film. For example, the thin film may comprise a low dielectric constant (low-k, or ultra-low-k) dielectric film that may be used in back-end-of-line (BEOL) metallization schemes for electronic devices. Such materials, which may include non-porous low-k dielectrics as well as porous low-k dielectrics, are susceptible to damage, e.g., degradation of dielectric constant, water absorption, residue formation, etc., when exposed to the chemistries necessary for removal of the mask layer and its sub-layers. Therefore, it is important to establish pattern transfer schemes that reduce the potential for damaging the underlying thin film when forming such a pattern and removing the necessary mask layer(s).

SUMMARY OF THE INVENTION

The present invention relates to a method for patterning a thin film on a substrate.

According to one embodiment, a method of double patterning a thin film using an anti-reflective coating (ARC) layer is described. A double pattern, formed in a mask layer overlying the ARC layer, is partially transferred to the ARC layer, and then the mask layer is removed. Thereafter, the pattern is completely transferred to the ARC layer using an etching process.

According to another embodiment, a method of patterning a thin film on a substrate, and a computer readable medium for patterning, are described, comprising: preparing a film stack on the substrate, the film stack comprising the thin film formed on the substrate, an anti-reflective coating (ARC) layer formed on the thin film, and a mask layer formed on the ARC layer; forming a first pattern in the mask layer; partially forming the first pattern in the ARC layer by forming the first pattern to a first depth less than the thickness of the ARC layer; forming a second pattern in the mask layer; partially forming the second pattern in the ARC layer by forming the second pattern to a second depth less than the thickness of the ARC layer; removing the mask layer; completing the forming of the first pattern and the second pattern in the ARC layer by etching the ARC layer; and transferring the first pattern and the second pattern to the thin film while substantially consuming the ARC layer.

According to yet another embodiment, a method of patterning a thin film on a substrate is described, comprising: preparing a film stack on the substrate, the film stack comprising the thin film formed on the substrate, an anti-reflective coating (ARC) layer formed on the thin film, and a first mask layer formed on the ARC layer; forming a first pattern in the first mask layer; partially forming the first pattern in the ARC layer by forming the first pattern to a first depth less than the thickness of the ARC layer; removing the first mask layer following the partial forming of the first pattern in the ARC layer; forming a second mask layer on the ARC layer; forming a second pattern in the second mask layer; partially forming the second pattern in the ARC layer by forming the second pattern to a second depth less than the thickness of the ARC layer; removing the second mask layer following the partial forming of the second pattern in the ARC layer; completing the forming of the first pattern and the second pattern in the ARC layer by etching the ARC layer; and transferring the first pattern and the second pattern to the thin film while substantially consuming the ARC layer.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

Figure 1A:
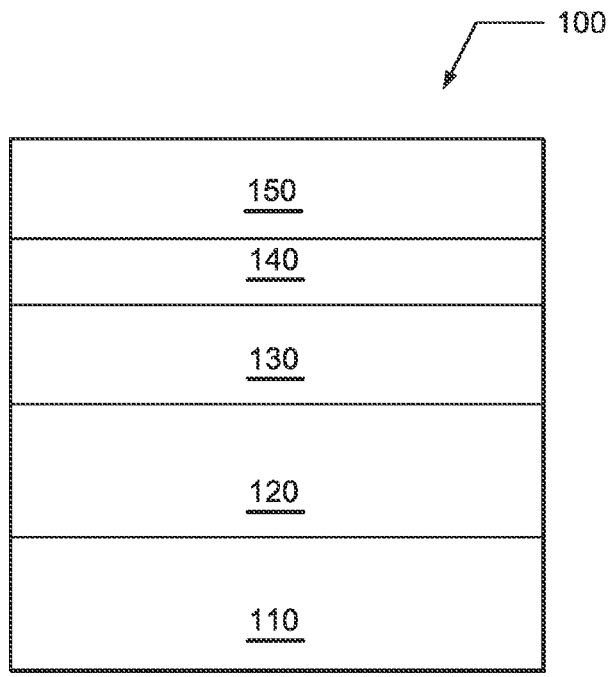
FIGS. 1A through 1J illustrate schematically a known method for patterning a thin film on a substrate.

As described above, double patterning lithography has been utilized to allow the patterning of smaller features at a smaller pitch than what is currently possible with standard lithographic techniques. Referring now to the drawings wherein like reference numerals designate identical or corresponding parts throughout the several views, FIGS. 1A through 1J schematically illustrate a method of double patterning a substrate according to the prior art. As illustrated in FIG. 1A, a lithographic structure 100 comprises a film stack formed on substrate 110. The film stack comprises a thin film 120, such as a dielectric layer, formed on substrate 110, an organic planarization layer (OPL) 130 formed on the thin film 120, an anti-reflective coating (ARC) layer 140 formed on the OPL 130, and a layer of photo-resist 150 formed on the ARC layer 140.

Figure 1B:
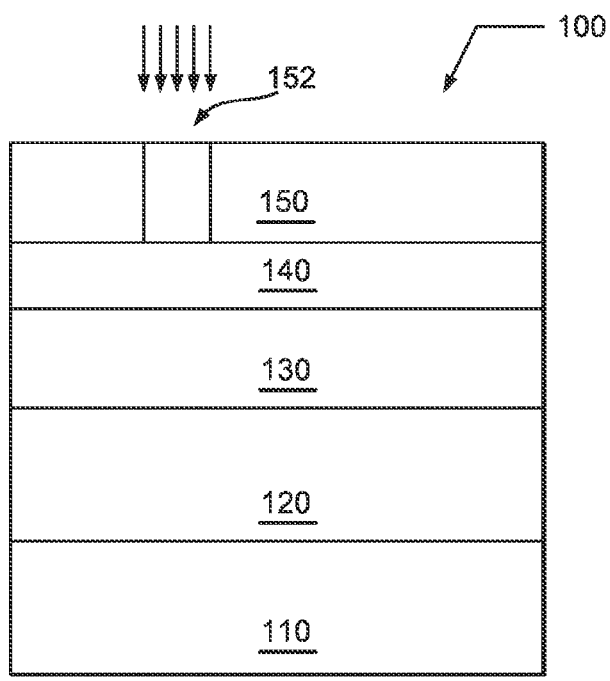
Figure 1C:
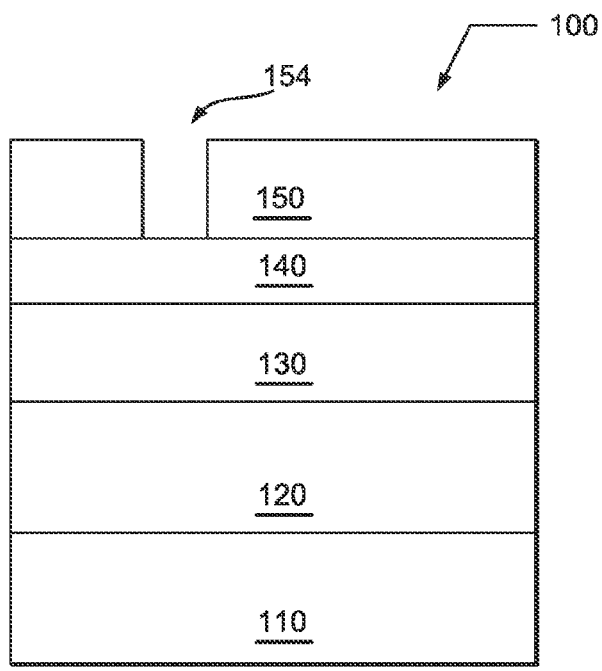
Figure 1D:
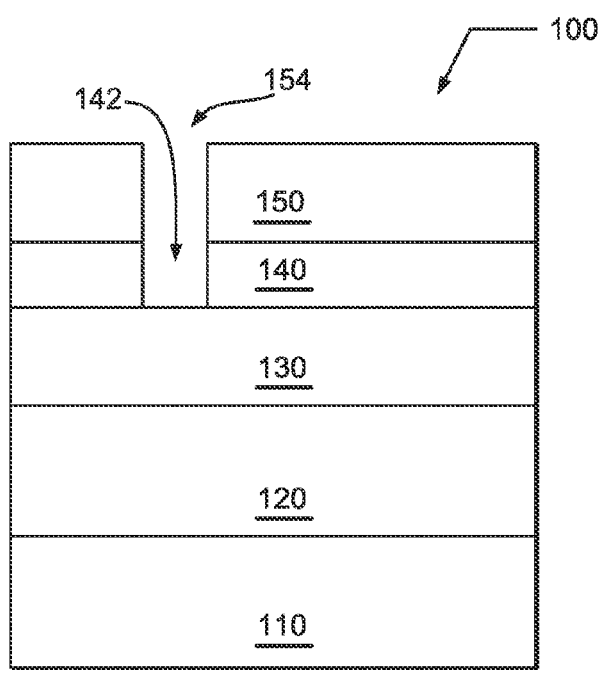

As shown in FIG. 1B, the layer of photo-resist 150 is exposed to a first image pattern 152 using a photo-lithography system, and thereafter in FIG. 1C, the first image pattern 152 is developed in a developing solvent to form a first pattern 154 in the photo-resist layer 150. The first pattern 154 in the photo-resist layer 150 is transferred to the underlying ARC layer 140 using a dry etching process to form a first ARC pattern 142 as shown in FIG. 1D.

Figure 1E:
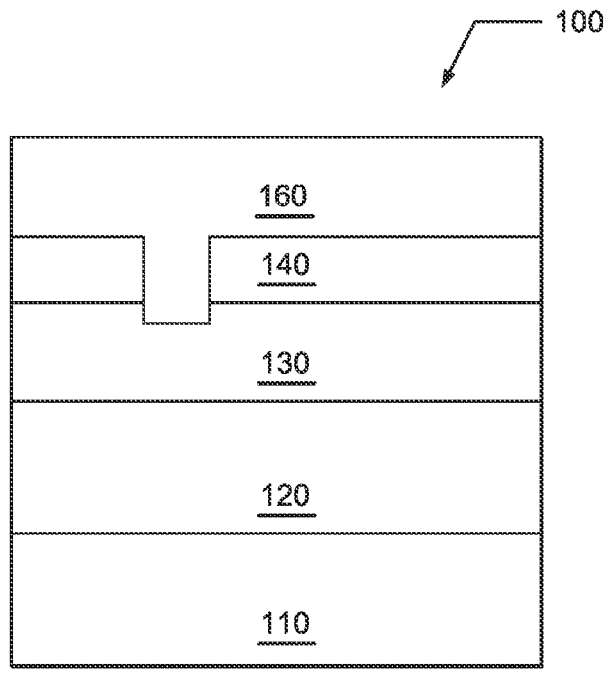
Figure 1F:
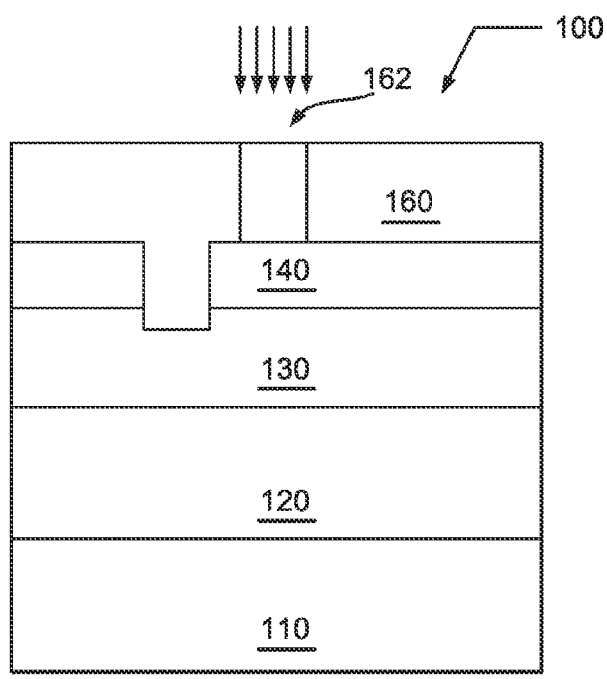
Figure 1G:
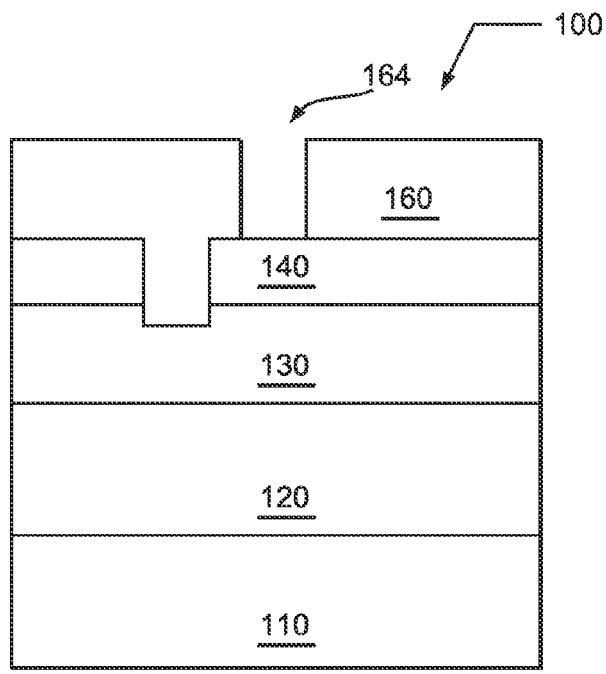
Figure 1H:
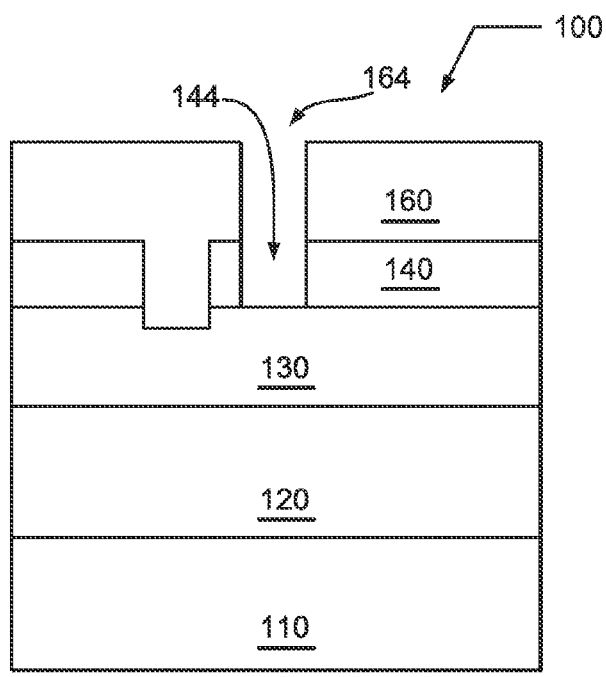

Now, as shown in FIG. 1E, photo-resist layer 150 is removed, and a second photo-resist layer 160 is applied to the ARC layer 140. The second photo-resist layer 160 is exposed to a second image pattern 162, as shown in FIG. 1F, using a photo-lithography system, and thereafter in FIG. 1G, the second image pattern 162 is developed in a developing solvent to form a second pattern 164 in the second photo-resist layer 160. The second pattern 164 in the second photo-resist layer 160 is transferred to the underlying ARC layer 140 using an etching process to form a second ARC pattern 144 as shown in FIG. 1H.

Figure 1I:
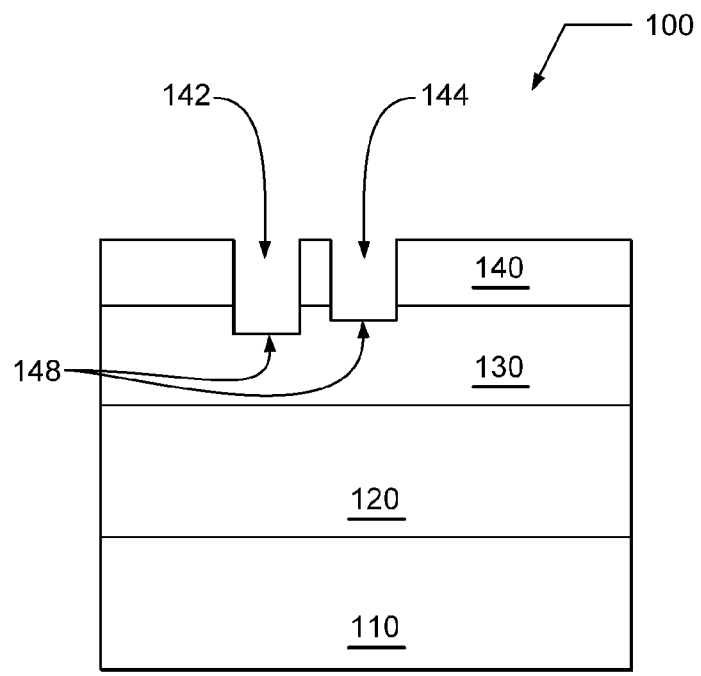
Figure 1J:
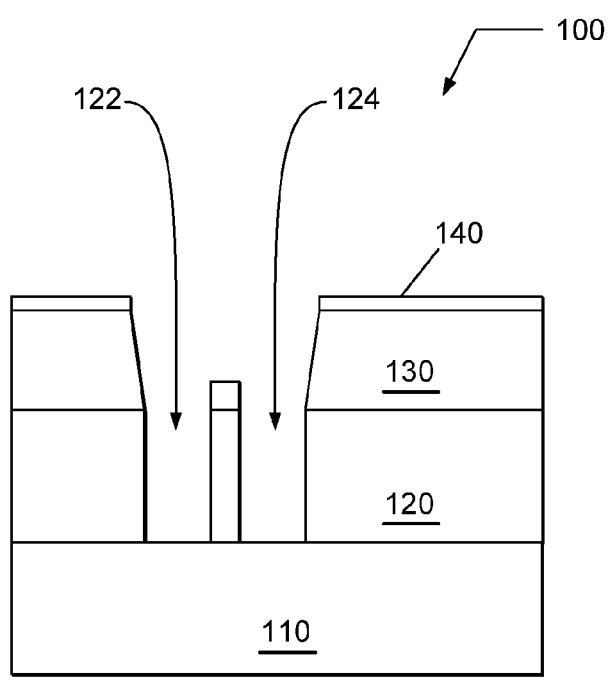

As illustrated in FIGS. 1I and 1J, respectively, the second layer of photo-resist 160 is removed, and the first and second ARC patterns 142 and 144 are transferred to the underlying OPL 130 and the thin film 120 to form a first feature pattern 122 and a second feature pattern 124 using one or more etching processes. However, as shown in FIGS. 1E and 1I, when a complete transfer of the first ARC pattern 142 and the second ARC pattern 144 to the ARC layer 140 is performed, an etch offset 148 is formed in the OPL 130 that can complicate the pattern transfer to the OPL 130 and the ARC layer 140.

For example, as shown in FIG. 1E, when photo-resist layer 150 is removed following the formation of the first ARC pattern 142 in the ARC layer 140, the first ARC pattern 142 is partially transferred to the underlying OPL 130 during the removal process. Furthermore, for example, as shown in FIG. 1I, when the second photo-resist layer 160 is removed following the formation of the second ARC pattern 144 in the ARC layer 140, the first ARC pattern 142 is further transferred to the underlying OPL 130 during the removal process and the second ARC pattern 144 is partially transferred to the underlying OPL 130 such that the etch offset 148 is developed. When the transfer of the double pattern to the OPL 130 is completed, an over-etch step may be necessary to completely land on the underlying thin film 120, which may pose a loss of critical dimension (CD).

Furthermore, as shown in FIG. 1J, once the pattern transfer to thin film 120 is complete, the ARC layer 140 is only partially consumed, thus, leaving material, in addition to the remaining OPL, to be removed. The inventors have observed that the process, such as a flash etch, required to remove the remaining ARC layer is detrimental to the material properties of the underlying thin film 120.

For example, the thin film 120 may comprise a low dielectric constant (low-k, or ultra-low-k) dielectric film that may be used in back-end-of-line (BEOL) metallization schemes for electronic devices. Such materials, which may include non-porous low-k dielectrics as well as porous low-k dielectrics, are susceptible to damage, e.g., degradation of dielectric constant, water absorption, residue formation, etc., when exposed to the chemistries necessary for removal of the ARC layer 140.

One option is to reduce the thickness of the ARC layer 140, such that it is substantially consumed during the transfer of the pattern to the thin film 120. However, the thickness of the ARC layer 140 is dictated by the requirements set forth for providing anti-reflective properties during the patterning of the layer of photo-resist. For instance, when the ARC layer is configured to cause destructive interference between incident electro-magnetic (EM) radiation and reflected EM radiation, the thickness ($\tau$) of the ARC layer 140 should be chosen to be a quarter wavelength (i.e., $\tau \sim \lambda/4$, $3\lambda/4$, $5\lambda/4$, etc.) of the incident EM radiation during the imaging of the layer of photo-resist. Alternatively, for instance, when the ARC layer is configured to absorb the incident EM radiation, the thickness ($\tau$) of the ARC layer 140 should be chosen to be sufficiently thick to permit absorption of the incident EM radiation. In either case, the inventors have observed for current geometries that the minimum thickness required to provide anti-reflective properties still leads to a partially consumed ARC layer following the transfer of the pattern to the underlying thin film.

Therefore, according to an embodiment of the invention, a method of double patterning a substrate is illustrated schematically in FIGS. 2A through 2K, and FIG. 3. The method is illustrated in a flow chart 300, and begins in 310 with forming a lithographic structure 200 comprising a film stack formed on substrate 210. The film stack comprises a thin film 220 formed on substrate 210, an optional organic planarization layer (OPL) 230 formed on the thin film 220, an anti-reflective coating (ARC) layer 240 formed on the optional OPL 230 (or on the thin film 220 if there is no OPL 230), and a first layer of photo-resist 250 formed on the ARC layer 240. Although the film stack is shown to be formed directly upon substrate 210, there may exist additional layers between the film stack and the substrate 210. For example, in a semiconductor device, the film stack may facilitate the formation of one interconnect level, and this interconnect level may be formed upon another interconnect level on substrate 210. Additionally, the thin film 220 may include a single material layer, or a plurality of material layers. For example, the thin film 220 may comprise a bulk material layer having a capping layer.

The thin film 220 may comprise a conductive layer, a non-conductive layer, or a semi-conductive layer. For instance, the thin film 220 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film 220 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 220 may have a dielectric constant of 3.7 or less, such as a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3™ semiconductor dielectric resins commercially available from Honeywell.

The thin film 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The optional OPL 230 can include a photo-sensitive organic polymer or an etch type organic compound. For instance, the photo-sensitive organic polymer may be poly- acrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

The ARC layer 240 possesses material properties suitable for use as an anti-reflective coating. The ARC layer 240 may include an organic material or an inorganic material. For example, the ARC layer 240 may include amorphous carbon (a-C), a-FC, or a material having a structural formula R:C:H:X, wherein R is selected from the group consisting of Si, Ge, B, Sn, Fe, Ti, and combinations thereof, and wherein X is not present or is selected from the group consisting of one or more of O, N, S, and F. The ARC layer 240 can be fabricated to demonstrate an optical range for index of refraction of approximately $1.40<n<2.60$, and for extinction coefficient of approximately $0.01<k<0.78$. Alternately, at least one of the index of refraction and the extinction can be graded (or varied) along a thickness of the ARC layer 240. Additional details are provided in U.S. Pat. No. 6,316,167, entitled "TUNABLE VAPOR DEPOSITED MATERIALS AS ANTI-REFLECTIVE COATINGS, HARDMASKS AND AS COMBINED ANTIREFLECTIVE COATING/HARDMASKS AND METHODS OF FABRICATION THEREOF AND APPLICATION THEREOF," assigned to International Business Machines Corporation, and the entire content of which is incorporated by reference herein in its entirety.

Furthermore, the ARC layer 240 can be formed using vapor deposition techniques including chemical vapor deposition (CVD) and plasma enhanced CVD (PECVD). For example, the ARC layer 240 can be formed using PECVD, as described in greater detail in pending U.S. patent application Ser. No. 10/644,958, entitled "METHOD AND APPARATUS FOR DEPOSITING MATERIALS WITH TUNABLE OPTICAL PROPERTIES AND ETCHING CHARACTERISTICS," filed on Aug. 21, 2003, the entire content of which is incorporated by reference herein in its entirety. The optical properties of the ARC layer 240, such as the index of refraction, can be selected so as to substantially match the optical properties of the underlying layer, or layers. For example, underlying layers such as non-porous dielectric films can require achieving an index of refraction in the range of $1.4<n<2.6$; and underlying layers such as porous dielectric films can require achieving an index of refraction in the range of $1.2<n<2.6$.

The first photo-resist layer 250 may comprise 248 nm (nanometer) resists, 193 nm resists, 157 nm resists, or EUV (extreme ultraviolet) resists. The first photo-resist layer 250 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 2A:
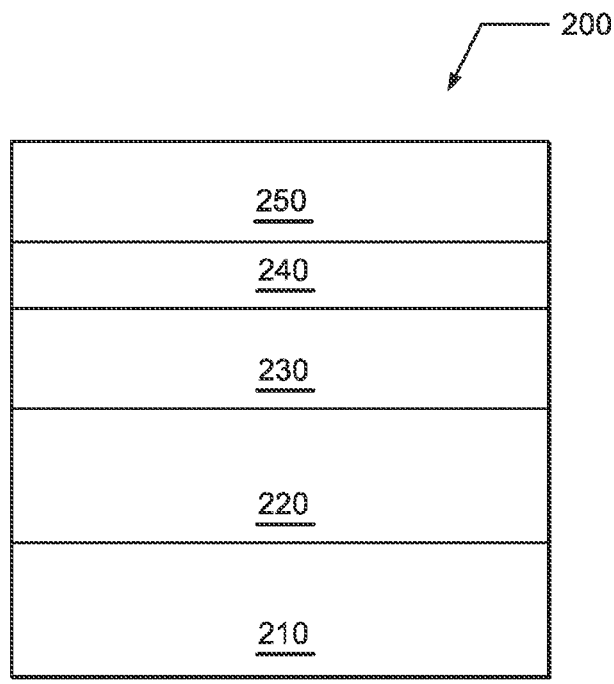
FIGS. 2A through 2K illustrate schematically a method for patterning a thin film on a substrate according to an embodiment of the invention.
Figure 2B:
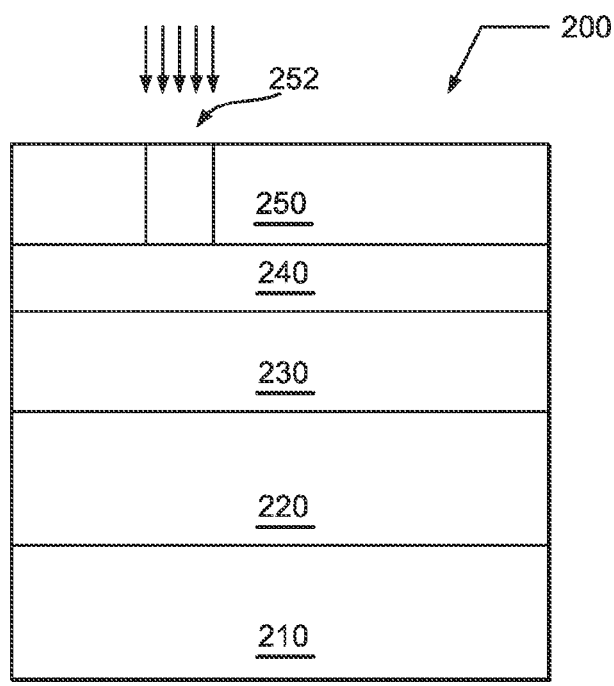
Figure 2C:
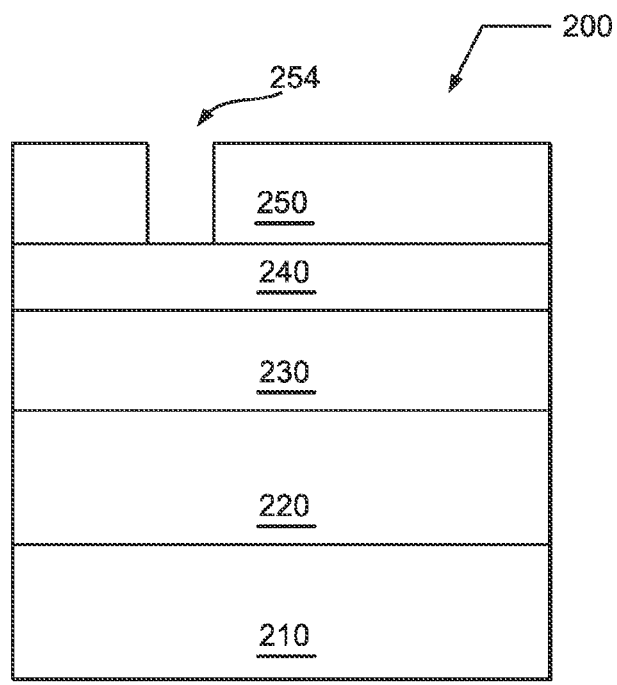

In 320 and as shown in FIGS. 2B and 2C, respectively, the first photo-resist layer 250 is patterned and developed. As shown in FIG. 2B, the first photo-resist layer 250 is imaged with a first image pattern 252 using a photo-lithography system. The exposure to EM radiation through a reticle is performed in a dry or wet photo-lithography system. The first image pattern 252 can be formed using any suitable conventional stepping lithographic system, or scanning lithographic system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

As shown in FIG. 2C, the exposed first photo-resist layer 250 is subjected to a developing process to remove the first image pattern 252, and form a first mask pattern 254 in the first photo-resist layer 250. The developing process can include exposing the substrate 210 to a developing solvent in a developing system, such as a track system. For example, the track system can comprise a Clean Track ACT 8, ACT 12, or Lithius resist coating and developing system commercially available from Tokyo Electron Limited (TEL).

Figure 2D:
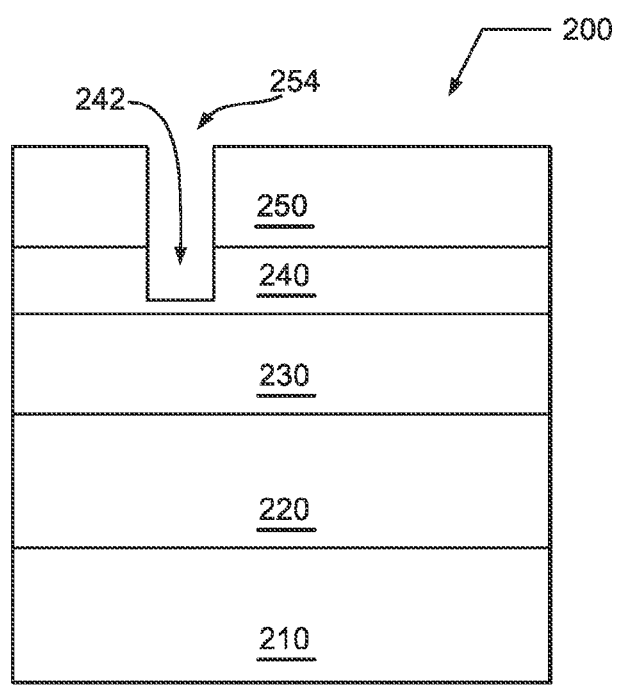

In 330 and as shown in FIG. 2D, the first mask pattern 254 is partially transferred to the underlying ARC layer 240 to form a first ARC pattern 242. The first ARC pattern 242 extends to a first depth less than the thickness of the ARC layer 240. For example, the first mask pattern 254 may be partially transferred to the underlying ARC layer 240 using an etching process, such as a dry etching process or a wet etching process. Alternatively, for example, the first mask pattern 254 may be partially transferred to the underlying ARC layer 240 using a dry plasma etching process or a dry non-plasma etching process. Alternatively yet, for example, the first mask pattern 254 may be partially transferred to the underlying ARC layer 240 using an anisotropic dry etching process, a reactive ion etching process, a laser-assisted etching process, an ion milling process, or an imprinting process, or a combination of two or more thereof.

Figure 2E:
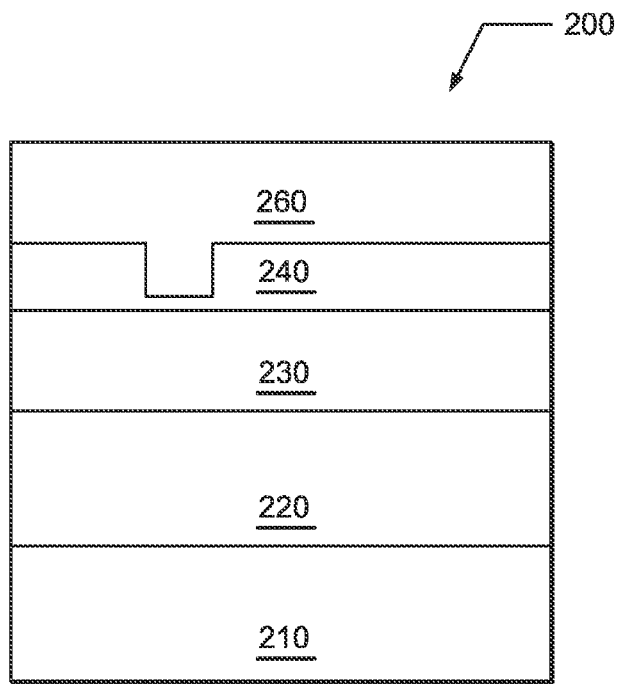

In 340, the first layer of photo-resist 250 is removed. For example, the first photo-resist layer 250 may be removed using a wet stripping process, a dry plasma ashing process, or a dry non-plasma ashing process. Thereafter, as shown in FIG. 2E, a second photo-resist layer 260 is formed on the ARC layer 240.

The second photo-resist layer 260 may comprise 248 nm (nanometer) resists, 193 nm resists, 157 nm resists, or EUV (extreme ultraviolet) resists. The second photo-resist layer 260 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 2F:
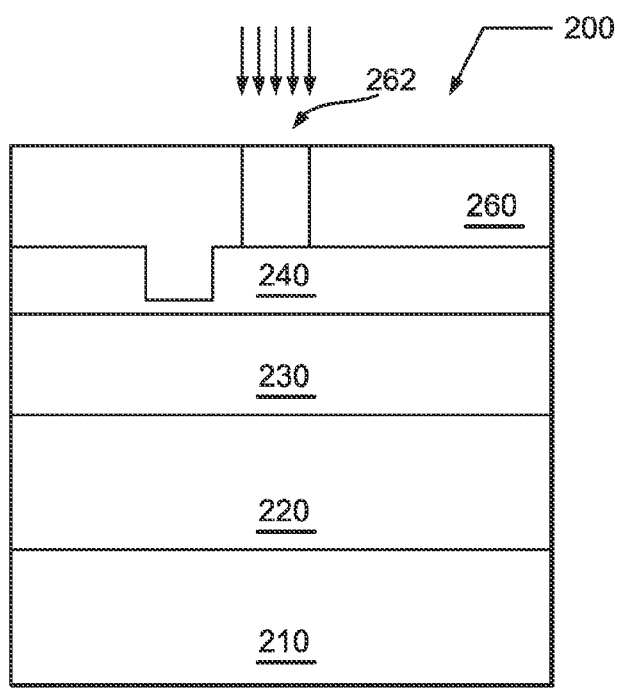
Figure 2G:
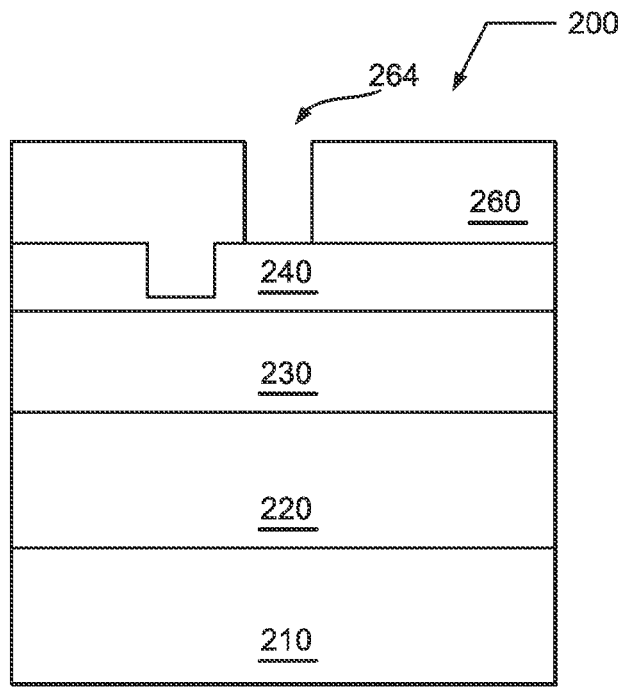

As shown in FIGS. 2F and 2G, respectively, the second photo-resist layer 260 is imaged with a second image pattern 262, and the exposed second photo-resist layer 260 is subjected to a developing process to remove the second image pattern 262 and form a second mask pattern 264 in the second photo-resist layer 260.

Figure 2H:
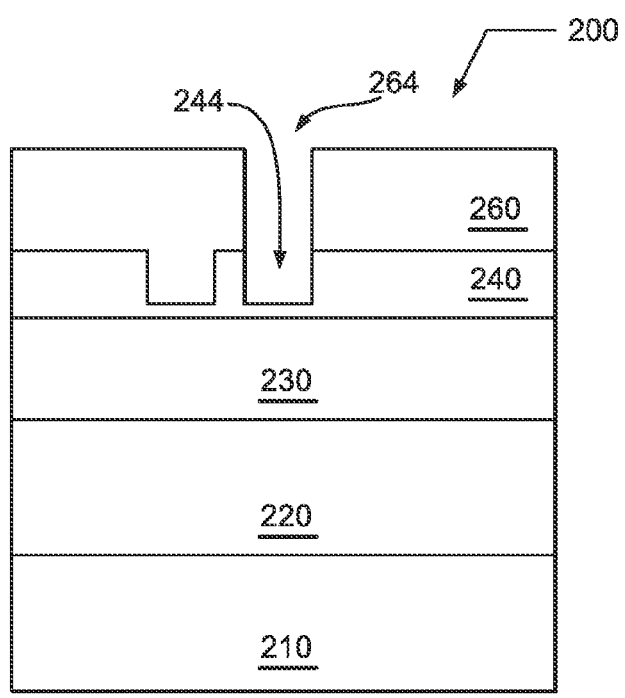
Figure 2I:
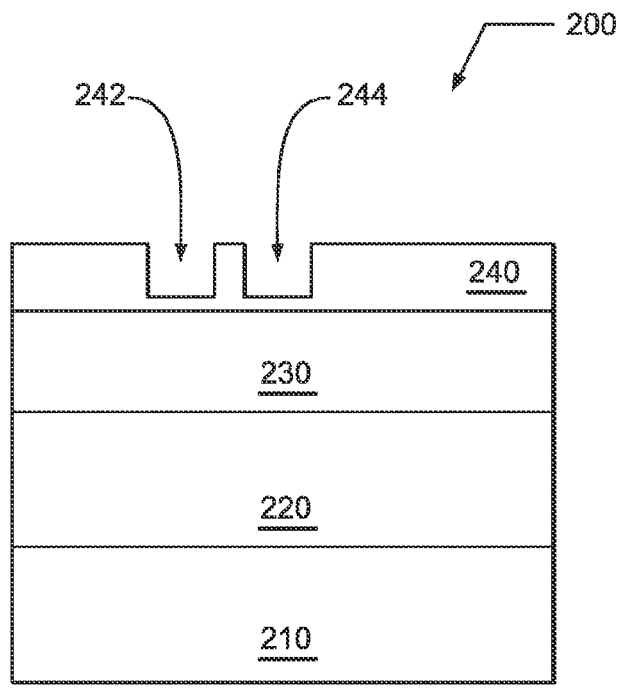

As shown in FIG. 2H, the second mask pattern 264 is partially transferred to the underlying ARC layer 240 to form a second ARC pattern 244. The second ARC pattern 244 extends to a second depth less than the thickness of the ARC layer 240. Thereafter, as shown in FIG. 2I, the second layer of photo-resist 260 is removed.

Other techniques may be utilized to double pattern, or multi-pattern, ARC layer 240 using a single layer of photo-resist rather than a first layer 250 and second layer 260. For example, the single layer of photo-resist may be double imaged, and then removed following the partial transfer of the double pattern to the underlying ARC layer. Alternatively, for example, the single layer of photo-resist may be imaged and developed, and these two steps may be repeated with the same layer of photo-resist. Thereafter, the layer of photo-resist may be removed following the partial transfer of the double pattern to the underlying ARC layer.

Figure 2J:
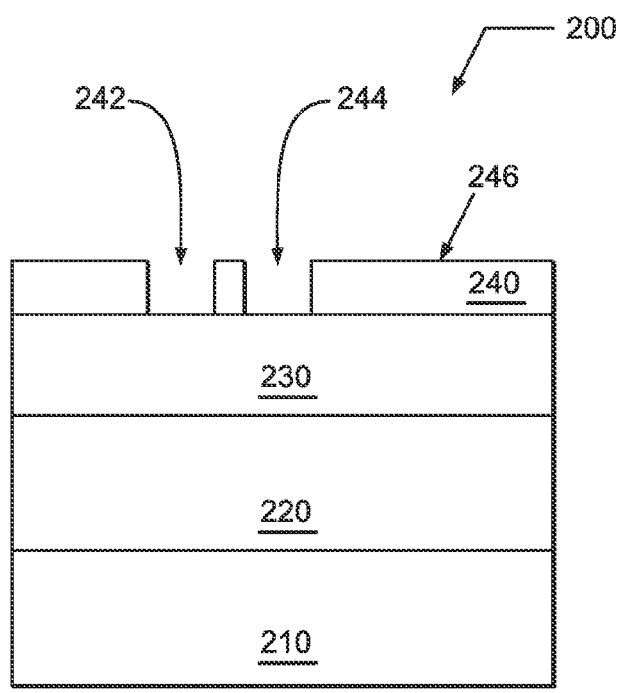

In 350 and as shown in FIG. 2J, the transfer of the ARC pattern 242 and the second ARC pattern 244 to ARC layer 240 is completed, while thinning the ARC layer 240. For example, the first ARC pattern 242 and the second ARC pattern 244 may be substantially transferred through the thickness of the ARC layer 240 using an etching process, such as a dry etching process or a wet etching process. Alternatively, for example, the etching process may comprise a dry plasma etching process or a dry non-plasma etching process. During the transfer of the ARC pattern 242 and the second ARC pattern 244 substantially through the ARC layer 240, the flat-field 246 is etched and the thickness of the ARC layer 240 is reduced.

Figure 2K:
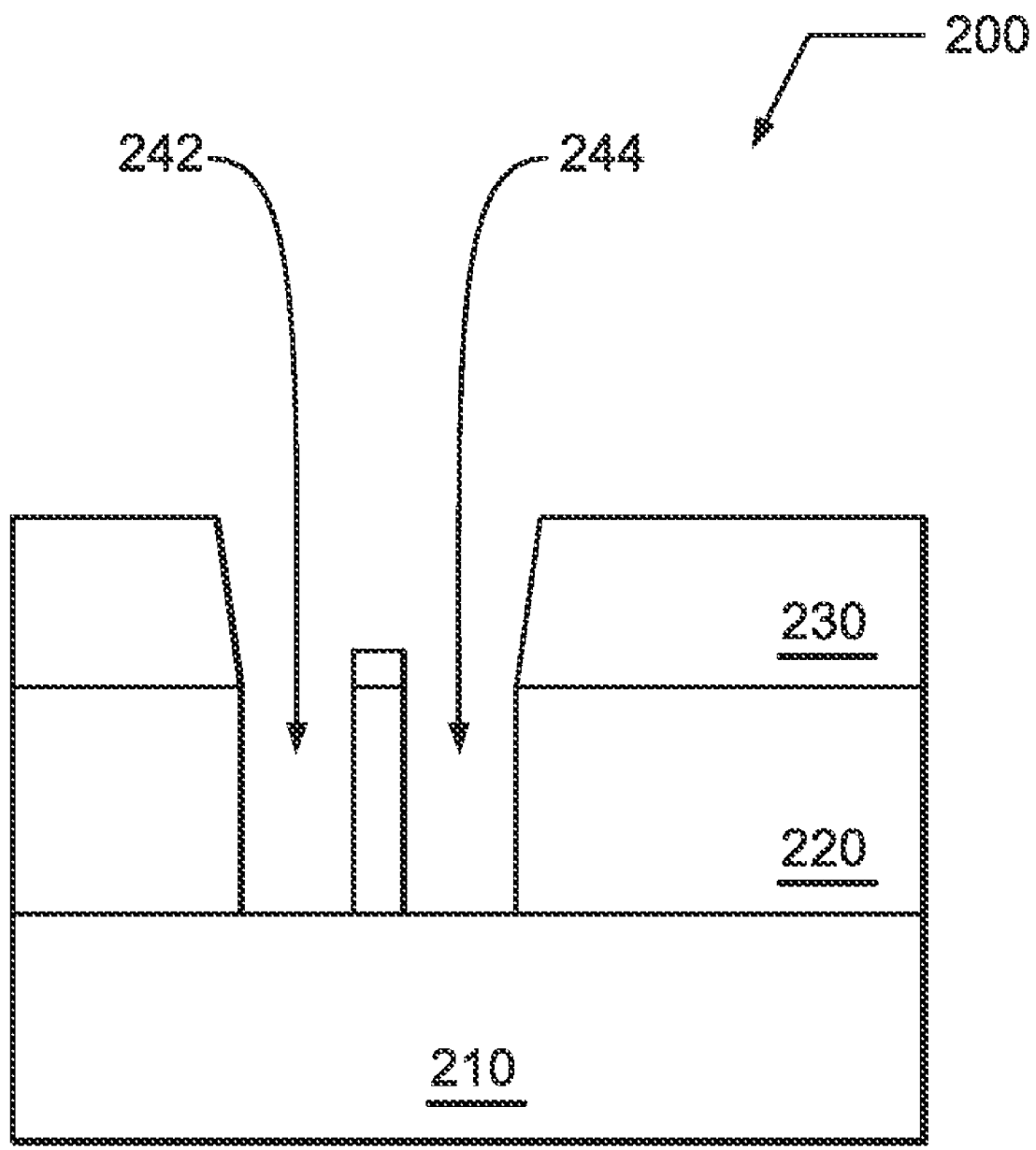
Figure 3:
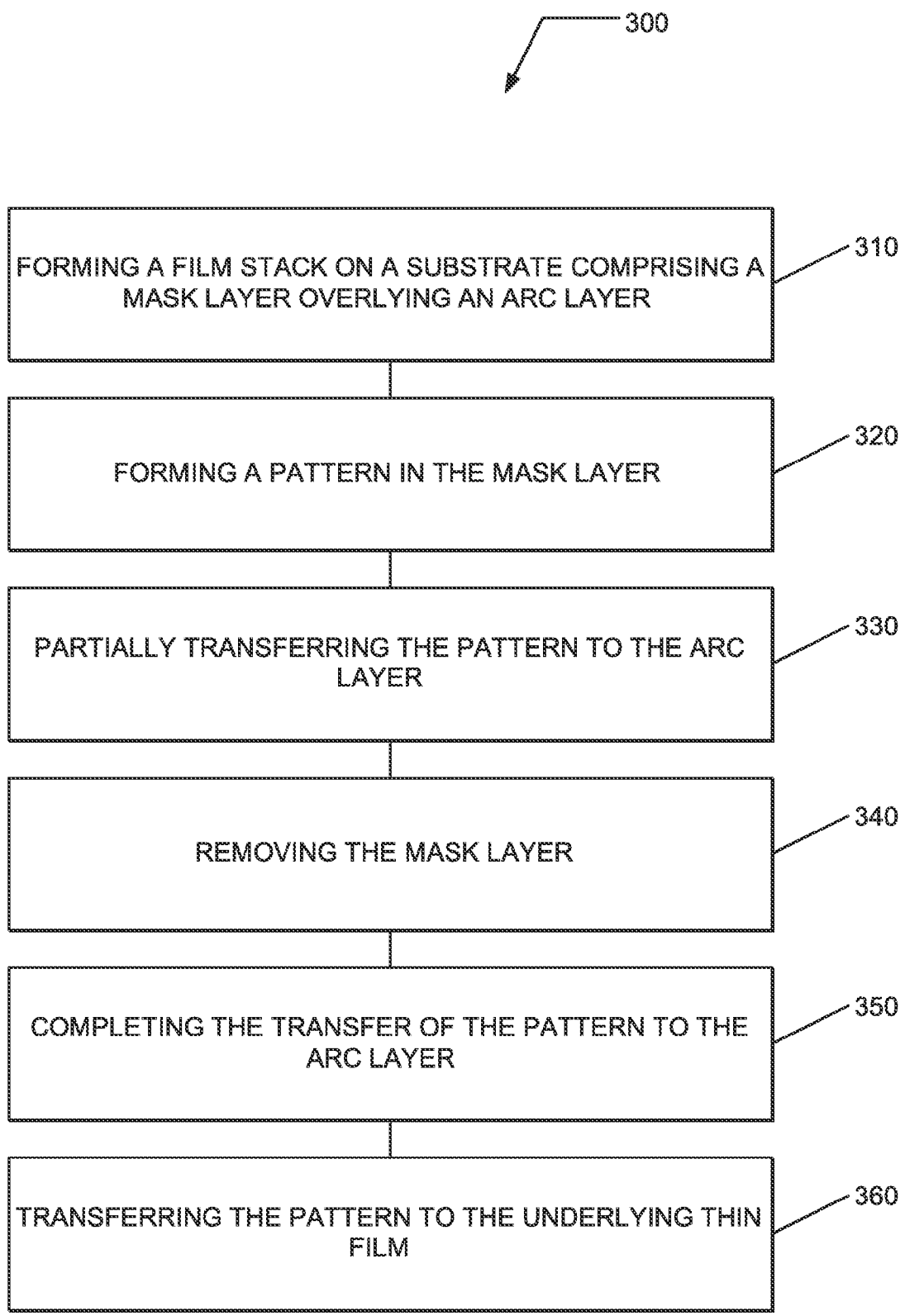
FIG. 3 illustrates a flow chart of a method for double patterning a thin film on a substrate according to an embodiment of the invention.

In 360 and as shown in FIG. 2K, the first ARC pattern 242 and the second ARC pattern 244 are transferred to the underlying OPL 230, if present, and to the thin film 220 to form a first feature pattern 222 and a second feature pattern 224 using one or more etching processes. During the one or more etching processes, the ARC layer 240 is substantially consumed, as illustrated in FIG. 2K. The one or more etching processes may include any combination of wet or dry etching processes. The dry etching processes may include dry plasma etching processes or dry non-plasma etching processes. Thereafter, the OPL 230, if present, may be removed.

According to another embodiment of the invention, a method of double patterning a substrate is illustrated in FIGS. 4A through 4J, and FIG. 5. The method is illustrated in a flow chart 500, and begins in 510 with forming a lithographic structure 400 comprising a film stack formed on substrate 410. The film stack comprises a thin film 420 formed on substrate 410, an optional organic planarization layer (OPL) 430 formed on the thin film 420, a developable anti-reflective coating (ARC) layer 440 formed on the optional OPL 430, and a first layer of photo-resist 450 formed on the developable ARC layer 440. Although the film stack is shown to be formed directly upon substrate 410, there may exist additional layers between the film stack and the substrate 410. For example, in a semiconductor device, the film stack may facilitate the formation of one interconnect level, and this interconnect level may be formed upon another interconnect level on substrate 410. Additionally, the thin film 420 may include a single material layer, or a plurality of material layers. For example, the thin film 420 may comprise a bulk material layer having a capping layer.

The thin film 420 may comprise a conductive layer, a non-conductive layer, or a semi-conductive layer. For instance, the thin film 420 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film 420 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 420 may have a dielectric constant of 3.7 or less, such as a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 420 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The optional OPL 430 can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

The developable ARC layer 440 possesses material properties suitable for use as an anti-reflective coating. Additionally, the developable ARC layer 440 comprises a light-sensitive material that, when exposed to electro-magnetic (EM) radiation, is chemically altered and thus configured to be removed using a developing solvent. For example, the developable ARC layer 440 may comprise (wet) developable anti-reflective coatings commercially available from Brewer Science. Inc. (2401 Brewer Drive, Rolla, Mo. 65401). Additionally, the developable ARC layer 440 is selected to be compatible with the overlying first photo-resist layer 250 and the lithographic wavelength, i.e., ArF, KrF, etc.

The first photo-resist layer 450 may comprise 248 nm (nanometer) resists, 193 nm resists, 157 nm resists, or EUV (extreme ultraviolet) resists. The first photo-resist layer 450 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 4A:
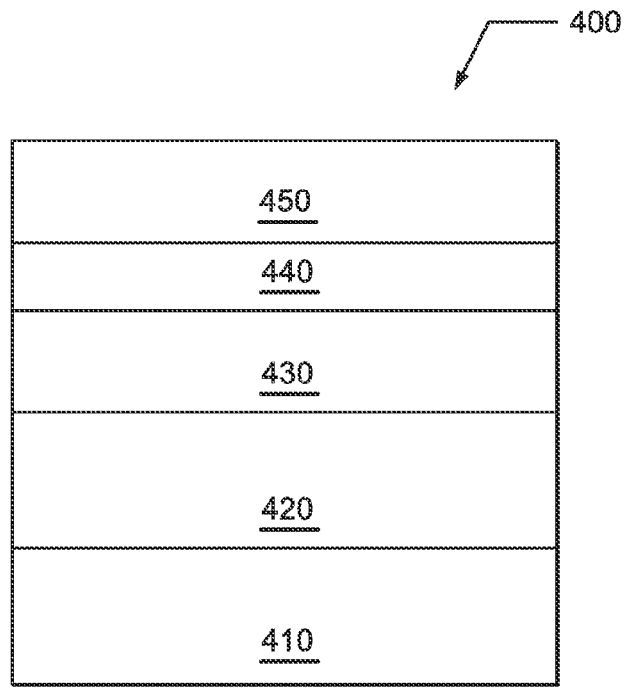
FIGS. 4A through 4J illustrate a method for patterning a thin film on a substrate according to another embodiment of the invention.
Figure 4B:
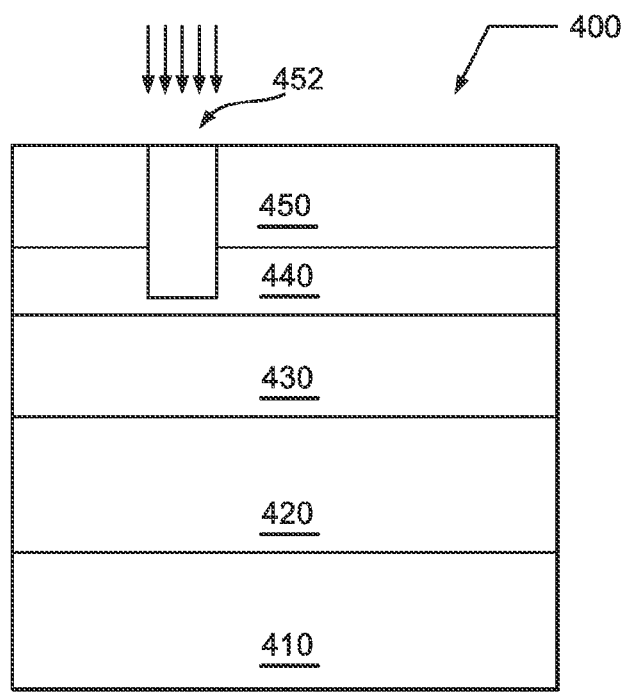

In 520 and as shown in FIG. 4B, the first photo-resist layer 450 is imaged with a first image pattern 452. The exposure to EM radiation through a reticle is performed in a dry or wet photo-lithography system. The first image pattern 452 can be formed using any suitable conventional stepping lithographic system, or scanning lithographic system. For example, the photo-lithographic system may be commercially available from ASML Netherlands B.V. or Canon USA, Inc., Semiconductor Equipment Division.

In 530 and as shown in FIG. 4B, the developable ARC layer 440 is partially imaged with the first image pattern 452. The first image pattern 452 extends to a first depth less than the thickness of the ARC layer 440. The partial imaging of the first image pattern 452 in the developable ARC layer 440 comprises setting at least one of an exposure dose, or an exposure depth of focus, or both in a photo-lithography system to achieve the partial image to said first depth. The exposure to EM radiation through a reticle is performed in a dry or wet photo-lithography system. Furthermore, the imaging of the first photo-resist layer 450 and the partial imaging of the developable ARC layer 440 may be performed at the same time or at separate times.

Figure 4C:
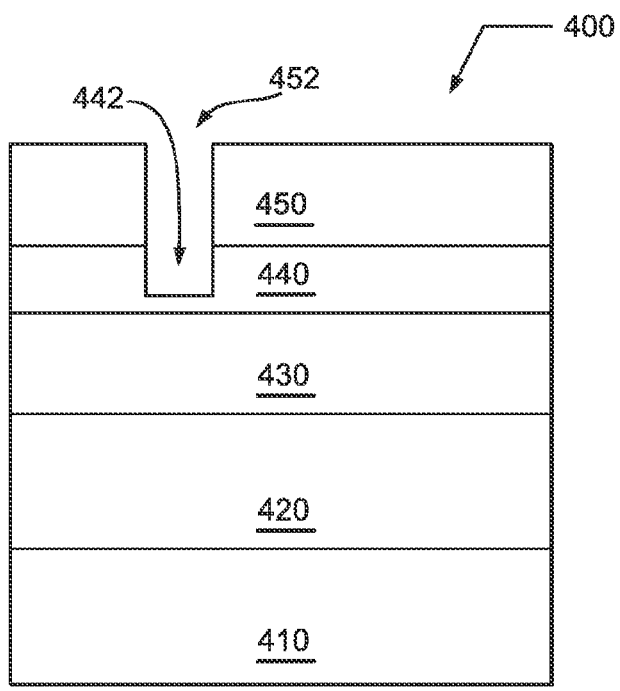

In 540 and as shown in FIG. 4C, the exposed first photo-resist layer 450 is subjected to a developing process to form a first mask pattern 454 in the first photo-resist layer 450. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

In 550 and as shown in FIG. 4C, the exposed developable ARC layer 440 is subjected to a developing process to form a first ARC pattern 442 in the developable ARC layer 440. The developing of the first photo-resist layer 450 and the developing of the developable ARC layer 440 may be performed at the same time or at separate times.

Figure 4D:
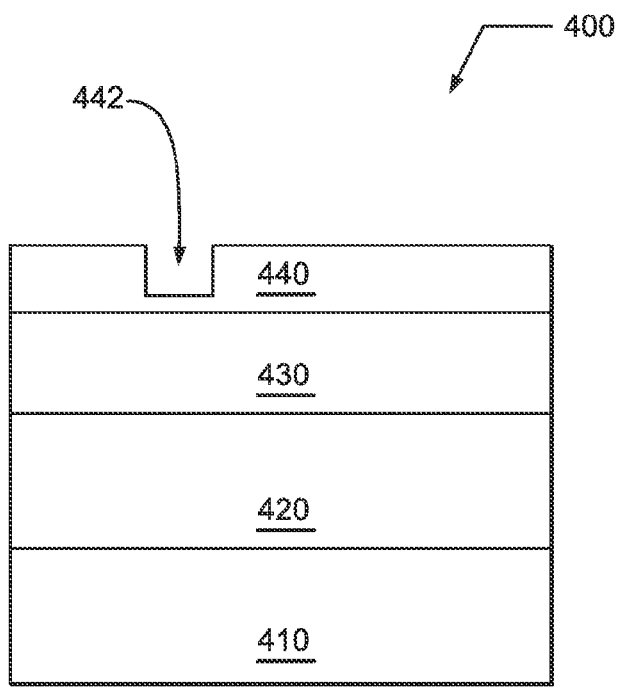
Figure 4E:
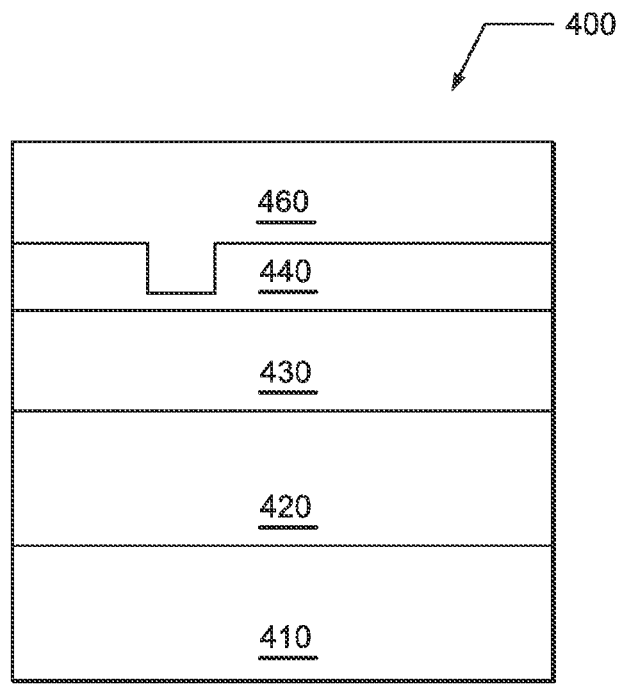

In 560 and as shown in FIG. 4D, the first layer of photo-resist 450 is removed. For example, the first photo-resist layer 450 may be removed using a wet stripping process, a dry plasma ashing process, or a dry non-plasma ashing process. Thereafter, as shown in FIG. 4E, a second photo-resist layer 460 is formed on the developable ARC layer 440.

The second photo-resist layer 460 may comprise 248 nm (nanometer) resists, 193 nm resists, 157 nm resists, or EUV (extreme ultraviolet) resists. The second photo-resist layer 460 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 4F:
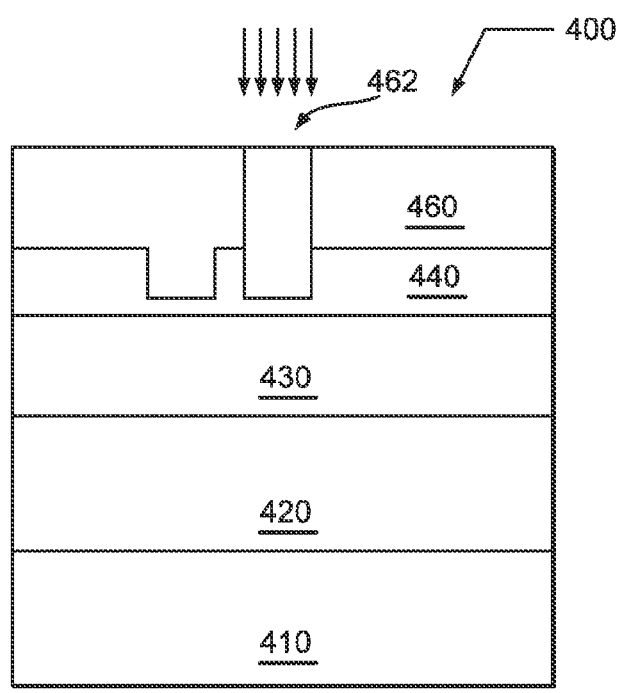
Figure 4G:
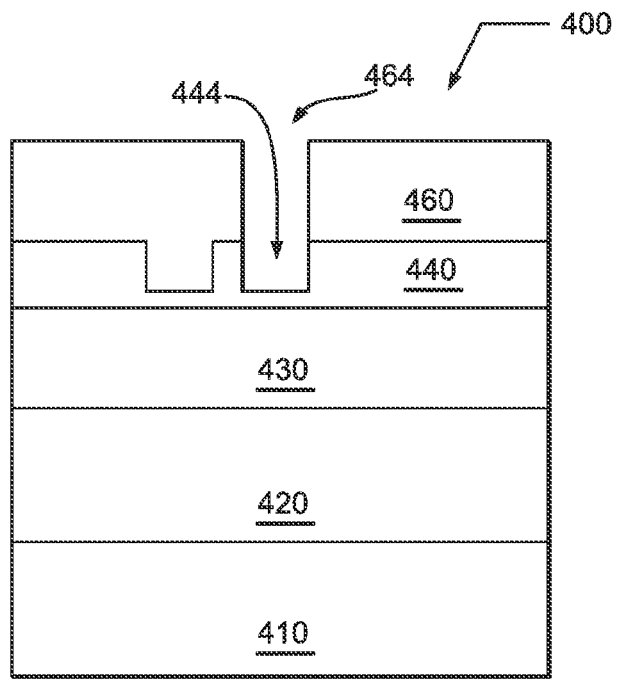
Figure 4H:
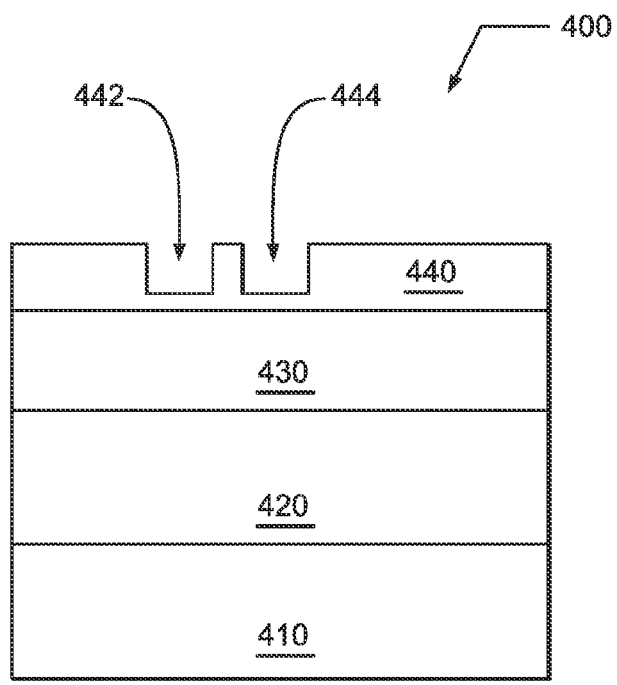

As shown in FIGS. 4F and 4G, respectively, the second photo-resist layer 460 is imaged with a second image pattern 462, and the exposed second photo-resist layer 460 is subjected to a developing process to remove the second image pattern 462 and form a second mask pattern 464 in the second photo-resist layer 460. Additionally, as shown in FIGS. 4F and 4G, the developable ARC layer 440 is partially imaged with the second image pattern 462, and the exposed developable ARC layer 440 is subjected to a developing process to remove the second image pattern 462 and form an second mask pattern 444 in the developable ARC layer 440. As shown in FIG. 4H, the second layer of photo-resist 460 is removed.

Other techniques may be utilized to double pattern, or multi-pattern, the developable ARC layer 440 using a single layer of photo-resist. For example, the single layer of photo-resist may be double imaged as described in co-pending U.S. patent application Ser. No. 11/534,261, entitled "METHOD FOR DOUBLE IMAGING A DEVELOPABLE ANTI-REFLECTIVE COATING" (TTCA-157), filed on even date herewith, and then removed following the partial developing of the double pattern in the underlying developable ARC layer. Alternatively, for example, the single layer of photo-resist may be imaged and developed while the developable ARC layer is partially developed, and these two steps may be repeated with the same layer of photo-resist as described in co-pending U.S. patent application Ser. No. 11/534,365, entitled "METHOD FOR DOUBLE PATTERNING A DEVELOPABLE ANTI-REFLECTIVE COATING" (TTCA-158), filed on even date herewith. The entire contents of these applications are herein incorporated by reference in their entirety.

Figure 4I:
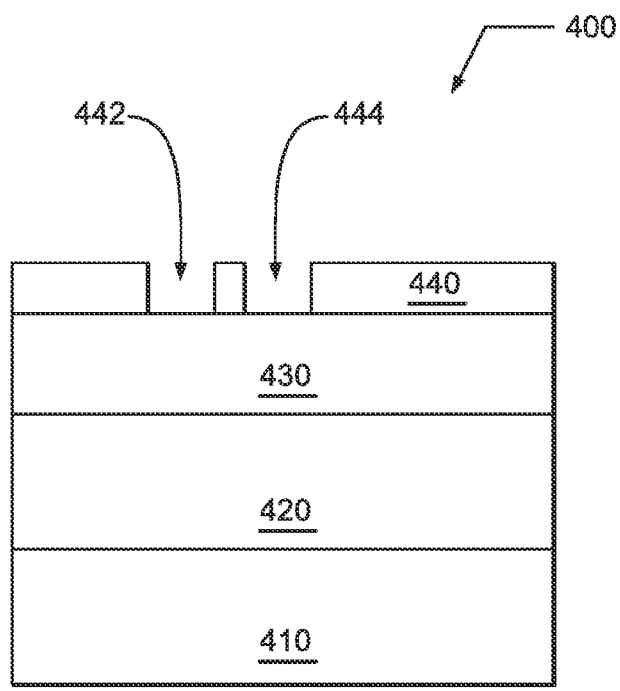

In 570 and as shown in FIG. 4I, the transfer of the first ARC pattern 442 and the second ARC pattern 444 to developable ARC layer 440 is completed, while thinning the developable ARC layer 440. For example, the first ARC pattern 442 and the second ARC pattern 444 may be substantially transferred through the thickness of the developable ARC layer 440 using an etching process, such as a dry etching process or a wet etching process. Alternatively, for example, the etching process may comprise a dry plasma etching process or a dry non-plasma etching process. During the transfer of the first ARC pattern 442 and the second ARC pattern 444 substantially through the developable ARC layer 440, the flat-field 446 is etched and the thickness of the developable ARC layer 440 is reduced.

Figure 4J:
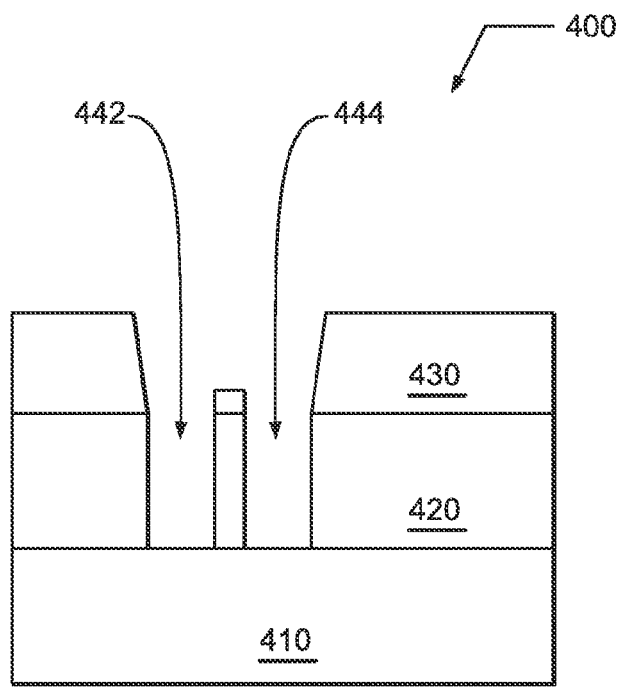
Figure 5:
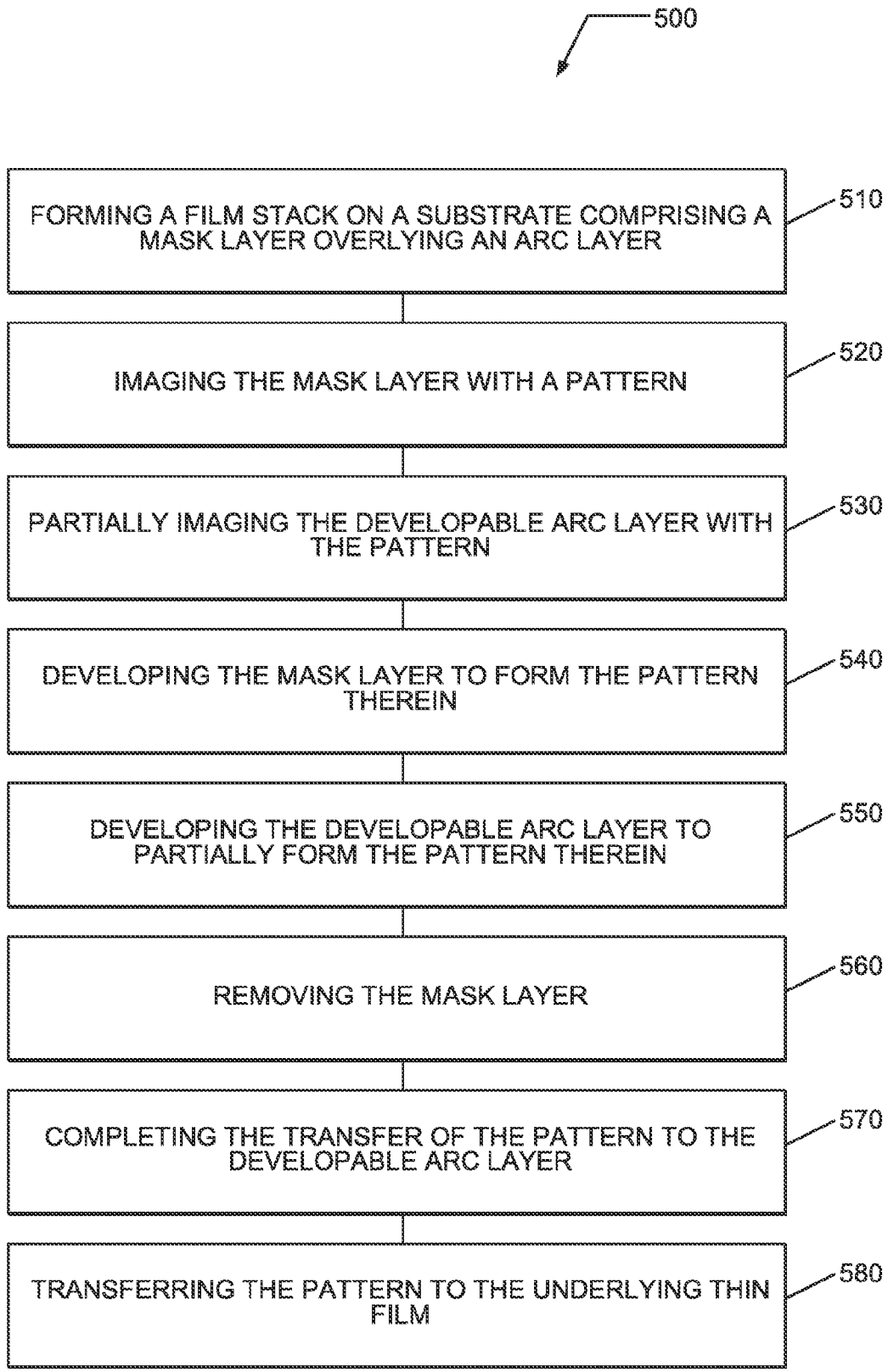
FIG. 5 illustrates a flow chart of a method for double patterning a thin film on a substrate according to another embodiment of the invention.

In 580 and as shown in FIG. 4J, the first ARC pattern 442 and the second ARC pattern 444 are transferred to the underlying OPL 430, if present, and to the thin film 420 to form a feature pattern 422 and a second feature pattern 424 using one or more etching processes. During the one or more etching processes, the developable ARC layer 440 is substantially consumed as illustrated in FIG. 4J. The one or more etching processes may include any combination of wet or dry etching processes. The dry etching processes may include dry plasma etching processes or dry non-plasma etching processes. Thereafter, the OPL 430, if present, may be removed.

Although only certain embodiments of this invention have been described in detail above, those skilled in the art will readily appreciate that many modifications are possible in the embodiments without materially departing from the novel teachings and advantages of this invention. For example, several embodiments illustrate the use of positive tone developable resists and developable ARC layers; however, other embodiments are contemplated that utilize negative tone developable resists and developable ARC layers. Accordingly, all such modifications are intended to be included within the scope of this invention.

What is claimed is:

1. A method of double patterning a thin film on a substrate, comprising:
preparing a film stack on said substrate, said film stack comprising said thin film formed on said substrate, an anti-reflective coating (ARC) layer formed on said thin film, and a mask layer formed on said ARC layer;
forming a first pattern in said mask layer;
partially forming said first pattern in said ARC layer by forming said first pattern to a first depth less than the thickness of said ARC layer;
forming a second pattern in said mask layer, wherein said second pattern is spaced apart from and non-overlapping with said first pattern;
partially forming said second pattern in said ARC layer by forming said second pattern to a second depth less than the thickness of said ARC layer;
removing said mask layer;
completing said partially forming of said first pattern and said second pattern in said ARC layer by etching said ARC layer; and
transferring said first pattern and said second pattern to said thin film while substantially consuming said ARC layer.

2. The method of claim 1, wherein said forming said mask layer comprises forming a layer of photo-resist.

3. The method of claim 2, wherein said forming said first pattern in said mask layer comprises:
imaging said mask layer with said first pattern using a photo-lithography system; and
developing said mask layer to form said first pattern in said mask layer.

4. The method of claim 3, wherein said partially forming said first pattern in said ARC layer comprises:
partially imaging said ARC layer with said first pattern using said photo-lithography system; and
partially developing said ARC layer to form said first pattern to said first depth, and
wherein said ARC layer comprises a developable ARC layer.

5. The method of claim 4, wherein said imaging of said mask layer with said first pattern is simultaneous with said partial imaging of said ARC layer with said first pattern.

6. The method of claim 4, wherein said developing of said mask layer to form said first pattern is simultaneous with said partial developing of said ARC layer to partially form said first pattern.

7. The method of claim 4, wherein said forming said second pattern in said mask layer comprises:
imaging said mask layer with said second pattern using said photo-lithography system; and
developing said mask layer to form said second pattern in said mask layer.

8. The method of claim 7, wherein said partially forming said second pattern in said ARC layer comprises:
partially imaging said ARC layer with said second pattern using said photo-lithography system; and
partially developing said ARC layer to form said second pattern to said second depth.

9. The method of claim 7, wherein said imaging of said mask layer with said second pattern and said partial imaging of said ARC layer with said second pattern follow said imaging of said mask layer with said first pattern and said partial imaging of said ARC layer with said first pattern, and wherein said developing said mask layer to form said first pattern, said partially developing said ARC layer to partially form said first pattern, said developing said mask layer to form said second pattern and said partially developing said ARC layer to partially form said second pattern follow said imaging said mask layer with said first and second patterns and said partial imaging of said ARC layer with said first and second patterns.

10. The method of claim 7, wherein said imaging of said mask layer with said second pattern, said partial imaging of said ARC layer with said second pattern, said developing said mask layer to form said second pattern and said partial developing said ARC layer to partially form said second pattern follow said imaging of said mask layer with said first pattern, said partial imaging of said ARC layer with said first pattern, said developing said mask layer to form said second pattern and said partial developing said ARC layer to partially form said second pattern.

11. The method of claim 1, wherein said partially forming said first pattern in said ARC layer comprises:
partially imaging said ARC layer with said first pattern using a photo-lithography system; and
partially developing said ARC layer to form said first pattern to said first depth, and
wherein said ARC layer comprises a developable ARC layer.

12. The method of claim 11, wherein said partially forming said second pattern in said ARC layer comprises:
partially imaging said ARC layer with said second pattern using said photo-lithography system; and
partially developing said ARC layer to form said second pattern to said second depth.

13. The method of claim 12, wherein the spacing between said first pattern and said second pattern in said ARC layer is greater than zero and less than or equal to approximately 50 nm.

14. The method of claim 1, wherein said partially forming said first pattern in said ARC layer comprises:
partially etching said ARC layer to partially transfer said first pattern from said mask layer to said ARC layer to form said first pattern to said first depth, and
wherein said ARC layer comprises an etch type ARC layer.

15. The method of claim 14, wherein said partially forming said second pattern in said ARC layer comprises:
partially etching said ARC layer to partially transfer said second pattern from said mask layer to said ARC layer in order to form said second pattern to said second depth.

16. The method of claim 15, wherein the spacing between said first pattern and said second pattern in said ARC layer is greater than zero and less than or equal to approximately 50 nm.

17. The method of claim 14, wherein said partially etching said ARC layer to partially transfer said first pattern comprises performing at least one of dry etching, or wet etching, or a combination thereof.

18. The method of claim 17, wherein said performing said dry etching comprises performing dry plasma etching, dry non-plasma etching, or a combination thereof.

19. The method of claim 14, wherein said partially etching said ARC layer to partially transfer said first pattern comprises performing an anisotropic dry etching process, a reactive ion etching process, a laser-assisted etching process, an ion milling process, or an imprinting process, or a combination of two or more thereof.

20. The method of claim 1, wherein said completing said transferring of said first pattern and said second pattern to said ARC layer comprises performing a wet etching process, or a dry etching process, or a combination thereof.

21. The method of claim 20, wherein said performing a dry etching process comprises performing a dry plasma etching process, or a dry non-plasma etching process, or a combination thereof.

22. The method of claim 1, wherein said forming said mask layer comprises forming a 248 nm resist, a 193 nm resist, a 157 nm resist, or an EUV resist, or a combination of two or more thereof on said ARC layer.

23. The method of claim 1, wherein said forming said film stack further comprises forming an organic planarization layer (OPL) on said thin film and forming said ARC layer on said OPL.

24. The method of claim 23, wherein said forming said OPL comprises forming a polyacrylate resin, an epoxy resin, a phenol resin, a polyamide resin, a polyimide resin, an unsaturated polyester resin, a polyphenylenether resin, a polyphenylenesulfide resin, or benzocyclobutene (BCB), or a combination of two or more thereof.

25. The method of claim 23, further comprising:
transferring said first pattern and said second pattern in said ARC layer to said OPL prior to said transferring said first pattern and said second pattern to said thin film.

26. The method of claim 25, wherein said transferring said first pattern and said second pattern in said ARC layer to said OPL comprises etching said first pattern and said second pattern into said OPL.

27. The method of claim 25, further comprising:
removing said OPL following said transferring said first pattern and said second pattern to said thin film.

28. The method of claim 25, wherein said transferring said first pattern and said second pattern in said ARC layer to said OPL substantially consumes said ARC layer.

29. The method of claim 1, wherein said forming said ARC layer comprises forming an organic layer, an inorganic layer, or both.

* * * * *